United States Patent [19]

Baron et al.

[11] Patent Number: 4,576,903

[45] Date of Patent: Mar. 18, 1986

[54] DEVELOPER FOR POSITIVE PHOTORESISTS

[75] Inventors: Winfried Baron, Rossdorf; Kurt Marquard, Reinheim; Hans-Joachim Merrem, Seeheim; Raimund Sindlinger, Ober-Ramstadt; Klaus-Peter Thiel, Brensbach-Wersau, all of Fed. Rep. of Germany

[73] Assignee: Merck Patent Gesellschaft mit beschränkter Haftung, Darmstadt, Fed. Rep. of Germany

[21] Appl. No.: 685,085

[22] Filed: Dec. 21, 1984

[30] Foreign Application Priority Data

Dec. 24, 1983 [DE] Fed. Rep. of Germany ....... 3346979

[51] Int. Cl.$^4$ ............................ G03C 5/00; G03F 7/00
[52] U.S. Cl. ..................................... 430/331; 430/309
[58] Field of Search ....................... 430/331, 493, 309

[56] References Cited

U.S. PATENT DOCUMENTS

| | | | |
|---|---|---|---|
| 3,586,504 | 6/1971 | Coates et al. | 430/141 |
| 4,001,133 | 1/1977 | Sorgenfrei et al. | 252/156 |
| 4,053,314 | 10/1977 | Kimura et al. | 430/493 |
| 4,147,545 | 4/1979 | Rowe et al. | 430/331 |
| 4,212,902 | 7/1980 | Lopez | 427/64 |
| 4,263,392 | 4/1981 | Jones | 430/156 |
| 4,374,920 | 2/1983 | Wanat et al. | 430/331 |

*Primary Examiner*—Mary F. Downey
*Attorney, Agent, or Firm*—Millen & White

[57] ABSTRACT

A developer suitable for use with positive photoresists is based on a buffered aqueous-alkaline solution containing non-ionic surfactants and contains in the solution 1-100 ppm of the surfactants, preferably of the ethoxylated-alkylphenol type. The resultant photoresist shows outstanding properties with respect to the resolution and edge sharpness obtainable in the developed resist image and with respect to its developing activity, developing capacity and stability.

11 Claims, No Drawings

DEVELOPER FOR POSITIVE PHOTORESISTS

BACKGROUND OF THE INVENTION

The present invention relates to a developer for positive photoresists, having improved properties with respect to the resolution and edge sharpness and definition, obtainable in the developed resist image, and with respect to its developing activity and capacity, and to stability.

Photoresist materials of both the positive and negative types are used in the photolithographic transfer of image structures in diverse ways.

In semiconductor technology and microelectronics, positive photoresist materials are of particular importance since, in the transfer of extremely fine image structures to conductor and semiconductor substrates, they guarantee a resolution which nowadays is still the best possible.

To produce positive resist images on a substrate, the latter is coated with the resist material in the form of a lacquer, and an image pattern is then transferred by exposure, for example through a mask, to the photoresist layer. In a subsequent developing process, the exposed photoresist areas are dissolved away, whereby a positive relief image is then formed on the substrate. Further structuring or modification, for example by etching, by metal coating or doping can then be carried out in the bared substrate areas.

The positive photoresist materials used are usually light-sensitive compositions based on phenol/formaldehyde condensation products of the novolak type as the resin components and compounds of the o-diazoquinone type as the light-sensitive components. By the action of light, usually in the ultraviolet range, the solubility of the exposed photoresist areas in an aqueous-alkaline medium is drastically increased. Such positive photoresist materials can therefore be developed in aqueous-alkaline developer systems. The progress in miniaturization in semiconductor technology, in paticular the VLSI technique (Very Large Scale Integration) for the production of highly and very highly integrated electronic components and circuits requires the highest possible degree of accuracy of reproduction in these photolithographic processes. Development as a process step is here of particular importance.

The quality of the positive photoresist relief structures to be obtained, with respect to resolution, edge definition, remaining layer thickness and surface quality is decided in particular by the influence of the developer during development, in addition to the precision of the exposure apparatus and the properties of the photoresist.

Positive photoresist developers of the state of the art customarily are aqueous solutions of compounds producing an alkaline pH value. In most case, they contain alkalis, such as alkali metal hydroxides, or alkali metal salts, for example alkali metal silicates or phosphates. For stabilizing the pH value of the solution, the developers can be buffered and, for improving wettability, they can contain a variety of surfactants.

The known developers have, however, the disadvantage that they also attack unexposed image areas of the resist layer to a not inconsiderable degree and cause noticeable layer removal. This manifests itself, in particular, also in the boundary regions between the exposed and unexposed image areas where, due to the layer removal by the developer, the 90° edges, desirable in the ideal case, of the remaining resist relief structures are bevelled and rounded to a considerable extent. This leads to only moderate contrast, a marked deterioration of the possible resolution, as given by the optical parameters, and an inaccurate image reproduction for the subsequent processes, such as etching, coating or doping of the substrate.

Moreover, known developers have only a limited stability and developing capacity. During storage and use, they show changes in the composition, so that reproducibility of the development results is not ensured over a prolonged period. It is therefore usual continuously to monitor the development processes on the substrate, which is to be developed, by means of methods which are expensive in apparatus, and to detect the end point of development. Furthermore, flocculation and deposition of impurities and degradation products of the developer and resist material are observed in the developer solution and, a particularly adverse factor, on the substrate.

There is therefore a demand for improved positive photoresist developers for microelectronics, in particular the VLSI technique.

OBJECTS OF THE INVENTION

It is therefore an object of the present invention to provide a positive photoresist developer which, with respect to the resolution and edge definition, to be obtained in the resist image, and with respect to stability, developing activity and developing capacity, has markedly improved properties.

Upon further study of the specification and appended claims, further objects and advantages of this invention will become apparent to those skilled in the art.

SUMMARY OF THE INVENTION

Surprisingly, it has now been found that a positive photoresist developer based on a buffered aqueous-alkaline solution which contains non-ionic surfactants, the developer containing 1-100 ppm of these surfactants in the solution, has excellent developing properties and longterm stability.

The invention thus relates to positive photoresist developers based on a buffered aqueous-alkaline solution, containing non-ionic surfactants, which developer contains 1-100 ppm, preferably 10-60 ppm and in particular 30-50 ppm, of the surfactants in the solution. In particular, the invention relates to such a developer which contains surfactants of the type of ethoxylated alkylphenols.

Moreover, the invention relates to a process for developing positive photoresist relief structures by treating an exposed positive photoresist coating with a developer which contains surfactants of the type of ethoxylated alkylphenols.

Moreover, the invention relates to a process for developing positive photoresist relief structures by treating an exposed positive photoresist coating with a developer solution, a developer of this type being used.

DETAILED DESCRIPTION

Developers for positive photoresist coatings, having similar or in some cases the same ingredients, are admittedly known; however, they contain substantially higher surfactant concentrations and, with respect to their developing properties, are not up to the current demands which have to be met by the VLSI technique.

Thus, for example, in German Offenlegungsschrift No. 3,223,386 corresponding to U.S. Pat. No. 4,374,920, aqueous-alkaline developers are described which also contain non-ionic surfactants but are predominantly intended for the production of printing plates. The indicated concentrations of 0.1–10% by weight of surfactant (corresponding to 1,000 to 100,000 ppm) here have the object of protecting the printing plate material, bared during development, from etching by the developer. These developers are unsuitable for the production of highly and very highly integrated electronic circuits and components.

U.S. Pat. No. 3,586,504 discloses developers based on aqueous sodium hydroxide solution for the production of metal masks in microelectronics, these developers containing non-ionic surfactants of the specific type of alkylphenoxypoly-(hydroxyalkylene oxides) in a proportion of at least 0.5% by weight (corresponding to 500 ppm). These developers also do not meet the current requirements with respect to the resolution and edge definition of sharpness to be obtained in the resist image.

The excellent developing properties of the developer according to the invention are due to the fact that it contains 1–100 ppm, preferably 10–60 ppm and in particular 30–50 ppm, of non-ionic surfactants.

In principle, all non-ionic surfactants, provided they are compatible with alkali, are suitable as the surfactant additive. Non-ionic surfactants of the type of ethoxylated alkylphenols are preferred. Ethoxylation products of alkyl phenols with 6–14 carbon atoms in the alkyl chain and degrees of ethoxylation from 2 to 20 are commercially available. An ethoxylated nonylphenyl having a mean degree of ethoxylation of about 9 is particularly preferred.

The advantages of the developer according to the invention, as compared with those according to the state of the art and having similar to the same ingredients, manifest themselves in the property of developing positive photoresist relief structures with a hitherto unobtainable resolution and edge definition and sharpness.

It is found that the developer according to the invention leaves the unexposed image areas of the positive photoresist layer virtually completely unaffected, and rapidly and completely dissolves the exposed image areas away down to the substrate, but only above a minimum exposure energy which admittedly can vary with different photoresists, but is in most cases about 10 mj/cm$^2$, relative to 1 $\mu$m of layer thickness.

Layer removal by the developer in the unexposed areas, if detectable at all, is very small and amounts to less than 5%. The surface of the resist layer remaining after development is smooth and plane and, in particular, does not show the depressions, called "pinholes", which otherwise occur very frequently and are particularly feared. By contrast, the developer according to the invention removes the exposed photoresist image areas at a high rate and without residues, so that the resulting relief structures have a hitherto not obtained contrast and a resolution which is then limited virtually only by the optical parameters. The remaining relief structures show almost ideal 90° edges without roundings and bevels.

A further advantage of the developer according to the invention is the wide latitude in developing time, made possible by this developer. In spite of the high developing activity which manifests itself in particularly rapid removal of the exposed resist material, the unexposed image areas are not attacked when the substrate coated with the resist remains in the developer solution for a prolonged period; moreover, overdevelopment does not take place. Due to this property, the developing process causes far fewer problems; expensive checks for the end point of development in the process sequence can be largely or completely omitted.

It has been found that surfactant concentrations higher than those stated have an unfavorable effect; presumably, passivation causes losses of activity. Longer times are then necessary for complete development, and these in turn entail intensified layer removal and losses in contrast and resolution. Moreover, in the case of higher surfactant concentrations, depositions of surfactant and of fractions or degradation products of the resist material on the bared substrate areas are found, and these are regarded as very disadvantageous.

In addition to these advantageous developing properties, the developer according to the invention shows excellent stability both in storage and in use. With appropriate preparation, storage and use, the composition remains remarkably constant; turbidity and flocculation, which are extremely disadvantageous in the production of microelectronic circuits and components, are not observed. Due to this unusual stability, the developer possesses a higher developing capacity, so that the same volume units of the developer solution can be better utilized with a substantially more permanent constancy and reproducibility of the result of development.

The developer according to the invention is prepared in a manner known per se. For this purpose, the quantitative proportions of the individual constituents are dissolved, if appropriate with heating, in water which advantageously should be fully desalinated and deaerated as far as possible. Altogether, it is advisable to ensure the highest purity in the selection of the starting materials and most careful exclusion of possible contamination and interference during preparation. The appropriate purity criteria are familiar to expert circles under the description "electronic grade". The other constituents of the developer are known from the state of the art. In general, the developers contain alkali metal compounds which are capable of producing hydroxyl ions by dissociation in aqueous solution. These include, for example, alkali metal silicates, alkali metal metasilicate, alkali metal phosphates and alkali metal hydroxide. These substances producing the alkaline pH value are present in the developer as a rule in a quantity of about 1–6% by weight, preferably about 2–5% by weight, relative to the total quantity of the developer solution.

An addition of sodium or potassium metasilicate, preferably sodium metasilicate pentahydrate, is preferred. Suitable buffer substances are in principle all the alkali metal salts of weak inorganic acids, or their mixtures, as are commonly used for such purposes. Potassium and sodium phosphate buffers, say those based on primary, secondary and/or tertiary sodium and potassium phosphates, are very suitable and therefore preferred. The most advantageous developing properties are obtained when the pH value of the developer is in the range between 12 and 14, preferably between 12.5 and 13.5. If necessary, the pH value can be adjusted by controlled addition of alkali metal hydroxide.

Using the developer according to the invention, in principle, all positive photoresist materials can be developed which are based essentially on mixtures of resin components of the novolak type and light-sensitive components of the o-diazoquinone type. In particular, these are mixtures of condensation products of formaldehyde with phenols, or compounds containing phenolic hydroxyl groups, and naphthoquinone-diazide-sulfonyl derivatives. A great variety of such photoresist compositions are known and are described, for example, in the Patent Specification DE-PS No. 938,233 corresponding to U.S. Pat. No. 3,106,465 and DE-PS No. 1,195,166 corresponding to U.S. Pat. No. 3,201,239 and in German Patent Application No. P 32 20 816 corresponding to U.S. patent application Ser. No. 500,693, filed June 3, 1983.

The process for developing positive photoresist relief structures, using the developer according to the invention, is carried out in a manner known per se. Initially, the substrate, for example a silicon wafer, is coated with a positive photoresist composition in the desired layer thickness. After drying of the resist and a heat treatment step customary for improving adhesion, the coated substrate is exposed imagewise through a mask original in a conventional exposure apparatus. This is followed by the actual developing process, in which the substrate carrying the exposed resist layer is exposed for a short period to the developer according to the invention, for instance by dipping or spraying. A relief image of highest precision, corresponding to the mask, is then formed in this way on the substrate.

After a further heat treatment of the resist image, which may be necessary, subsequent process steps on the substrate thus structured can, for example, be etching processes, such as wet or dry etching (for example plasma-etching), doping of the substrate, for instance by wet doping, gas-phase diffusion or ion implantation, and metal coating, for example by electrolytic metal deposition or by vapour-deposition processes.

Without further elaboration, it is believed that one skilled in the art can, using the preceding description, utilize the present invention to its fullest extent. The following preferred specific embodiments are, therefore, to be construed as merely illustrative, and not limitative of the remainder of the disclosure in any way whatsoever. In the following examples, all temperatures are set forth uncorrected in degrees Celsius; unless otherwise indicated, all parts and percentages are by weight.

EXAMPLE 1

(a) Composition of the developer:

| 92.655% by weight | water |
| 5.130% by weight | $Na_2SiO_3.5H_2O$ |
| 1.250% by weight | $NaHPO_4.2H_2O$ |
| 0.850% by weight | $Na_3PO_4.12 H_2O$ |
| 0.110% by weight | NaOH |
| 0.005% by weight (50 ppm) | of an ethoxylated nonylphenol having a mean degree of ethoxylation of 9 |

Use:
A commercially available positive photoresist coating based on a 5-oxo-6-diazo-5,6-dihydronaphthalenesulfonic acid ester and a cresol/formaldehyde novolak resin is applied by spin-coating to superficially thermally oxidised silicon wafers. After initial drying for 30 minutes at 90°, the layer thickness is 1.2 μm. Subsequently the wafers are exposed for different times by the contact-exposure process through a mask with a line pattern, using a 200 W Hg lamp and an intensity of 6.5 mW/cm² at 365 nm.

(b) The wafers are then developed for 60 seconds in the developer according to (a) at 22° C. After development, the relief structures obtained are assessed and the remaining residual layer thickness is measured.

Depending on the exposure time, the following residual layer thicknesses were found:

| Exposure time | Residual layer thickness |
|---|---|
| 0 seconds (unexposed area) | 1.15 μm |
| 0.5 second | 1.15 μm |
| 1.0 second | 1.15 μm |
| 1.5 seconds | 1.15 μm |
| 2.0 seconds | 0 μm |
| 2.5 seconds | 0 μm |

An assessment of the structures in the photoresist under the scanning electron microscope show that patterns having a structural width of 1 μm and less are cleanly developed and highly resolved at an exposure time of 2 seconds and higher, while layer removal of less than 5% is found in the unexposed area or areas for exposure times under 2 seconds. The relief images show smooth, plane surfaces without depressions and with sharp, steep edges without roundings or bevels. Depositions of impurities are not detectable either on the resist image or on the bared substrate.

EXAMPLE 2

(a) Composition of the developer:

| 96.365% by weight | water |
| 2.210% by weight | $Na_2SiO_3.5H_2O$ |
| 0.880% by weight | $Na_2HPO_4.2H_2O$ |
| 0.440% by weight | $Na_3PO_4.12H_2O$ |
| 0.100% by weight | NaOH |
| 0.005% by weight (50 ppm) | surfactant as in Example 1a. |

(b) Use:
The use analogously to Example 1(b) gives equally good results.

EXAMPLE 3

(a) Composition of the developer:

| 96.460% by weight | water |
| 2.210% by weight | $Na_2SiO_3.5H_2O$ |
| 0.884% by weight | $Na_3PO_4.12H_2O$ |
| 0.442% by weight | $Na_2HPO_4.2H_2O$ |
| 0.004% by weight (40 ppm) | surfactant as in Example 1a. |

(b) Use:
The use analogously to Example 1(b) gives equally good results.

COMPARISON EXAMPLE A (a) Composition of the developer:
As in Example 1(a), but with 0.1% by weight (1,000 ppm) of the surfactant.

(b) Use:
In development analogously to Example 1b, no completely developed relief structures are obtainable even at exposure times of 10 seconds.

COMPARISON EXAMPLE B (a) Composition of the developer:
As in Example 1a, but without surfactant.

(b) Use:
When used analogously to Example 1(b), the following dependence of the remaining residual layer thickness on the exposure time is found:

| Exposure time | Residual layer thickness |
| --- | --- |
| 0 seconds (unexposed area) | 0.90 μm |
| 0.5 second | 0.75 μm |
| 1.0 second | 0.25 μm |
| 1.5 seconds | 0 μm |
| 2.0 seconds | 0 μm |
| 2.5 seconds | 0 μm |

Considerable layer removal is found at exposure times below 2 seconds and in the unexposed area.

The relief images show irregular surfaces and strongly rounded or bevelled transitions in the boundary regions between the resist and the bared substrate.

The preceding examples can be repeated with similar success by substituting the generically or specifically described reactants and/or operating conditions of this invention for those used in the preceding examples.

From the foregoing description, one skilled in the art can easily ascertain the essential characteristics of this invention, and without departing from the spirit and scope thereof, can make various changes and modifications of the invention to adapt it to various usages and conditions.

What is claimed is:

1. In a developer for positive photoresists of the phenol/formaldehyde-novolak type containing an o-diazoquinone-type compound as a light-sensitive component,
    consisting essentially of effective amounts of,
    water,
    an inorganic alkali metal compound producing hydroxyl ions in water,
    a buffer maintaining a pH of about 12–14,
    and a non-ionic surfactant,
    the improvement wherein the amount of non-ionic surfactant is about 1–100 ppm,
    whereby said developer is effective to develop said positive photoresist with high resolution.

2. A developer according to claim 1, which contains 10–60 ppm of the surfactant.

3. A developer according to claim 1, which contains 30–50 ppm of the surfactant.

4. A developer according to claim 1, wherein the surfactant is an ethoxylated alkylphenol.

5. A developer of claim 1 wherein the non-ionic surfactant is an ethoxylated ($C_{6-14}$-alkyl)phenol of a degree of ethoxylation of 2 to 20.

6. A developer of claim 5 wherein the degree of ethoxylation is about 9.

7. A developer of claim 4 wherein the alkali metal compound is a silicate, a metasilicate, a phosphate or a hydroxide.

8. A developer of claim 7 wherein the amount of alkali metal compound is about 1–6% by weight.

9. A developer of claim 8 wherein the alkali metal compound is a metasilicate.

10. A developer of claim 1 wherein the pH maintained by the buffer is about 12.5–13.5.

11. A developer of claim 1 consisting of water, said alkali metal compound, said buffer and said surfactant.

* * * * *